United States Patent [19]

May et al.

[11] Patent Number: 4,572,921
[45] Date of Patent: Feb. 25, 1986

[54] ELECTROMAGNETIC SHIELDING DEVICE

[75] Inventors: James P. May, Scranton, Pa.; Arthur R. Eppler, Clifton, N.J.

[73] Assignee: Instrument Specialties Co., Inc., Delaware Water Gap, Pa.

[21] Appl. No.: 635,847

[22] Filed: Jul. 30, 1984

[51] Int. Cl.$^4$ .............................................. H05K 9/00
[52] U.S. Cl. ................................. 174/35 GC; 267/165
[58] Field of Search .......... 174/35 GC, 35 MS, 35 R; 219/10.55 D; 428/573, 575, 595; 24/129 B, 265 A, 295; 267/164, 165

[56] References Cited

U.S. PATENT DOCUMENTS

| | | |
|---|---|---|
| 2,825,042 | 2/1958 | Tollefson et al. .......... 174/35 GC X |
| 2,844,644 | 7/1958 | Soule, Jr. ........................ 174/35 GC |
| 3,277,230 | 10/1966 | Stickney et al. ............... 174/35 GC |
| 3,504,095 | 3/1970 | Roberson et al. . |
| 3,904,810 | 9/1975 | Kraus . |
| 4,115,655 | 9/1978 | Prentice . |

FOREIGN PATENT DOCUMENTS 1179975 2/1970 United Kingdom .......... 174/35 GC

OTHER PUBLICATIONS

Lockhart, *Twin Flex Contact*, IBM Technical Disclosure Bulletin, vol. 13, No. 10, p. 3095, Mar. 1971.
IBM Technical Disclosure Bulletin, "Fingerstock Expander", M. A. Lockhart, vol. 12, No. 3, Aug. 1969, p. 413.
IBM Technical Disclosure Bulletin, "Double Receptacle Shielding", M. A. Lockhart, vol. 14, No. 8, Jan. 1972, p. 2534.

*Primary Examiner*—A. T. Grimley
*Assistant Examiner*—D. A. Tone
*Attorney, Agent, or Firm*—Burns, Doane, Swecker & Mathis

[57] ABSTRACT

An electromagnetic shielding device includes a continuous metallic strip having a plurality of fingers defining spaces therebetween, and a base portion including a plurality of segments which are arranged so as to securely mount the shielding device in a channel having a linear or irregular configuration.

28 Claims, 6 Drawing Figures

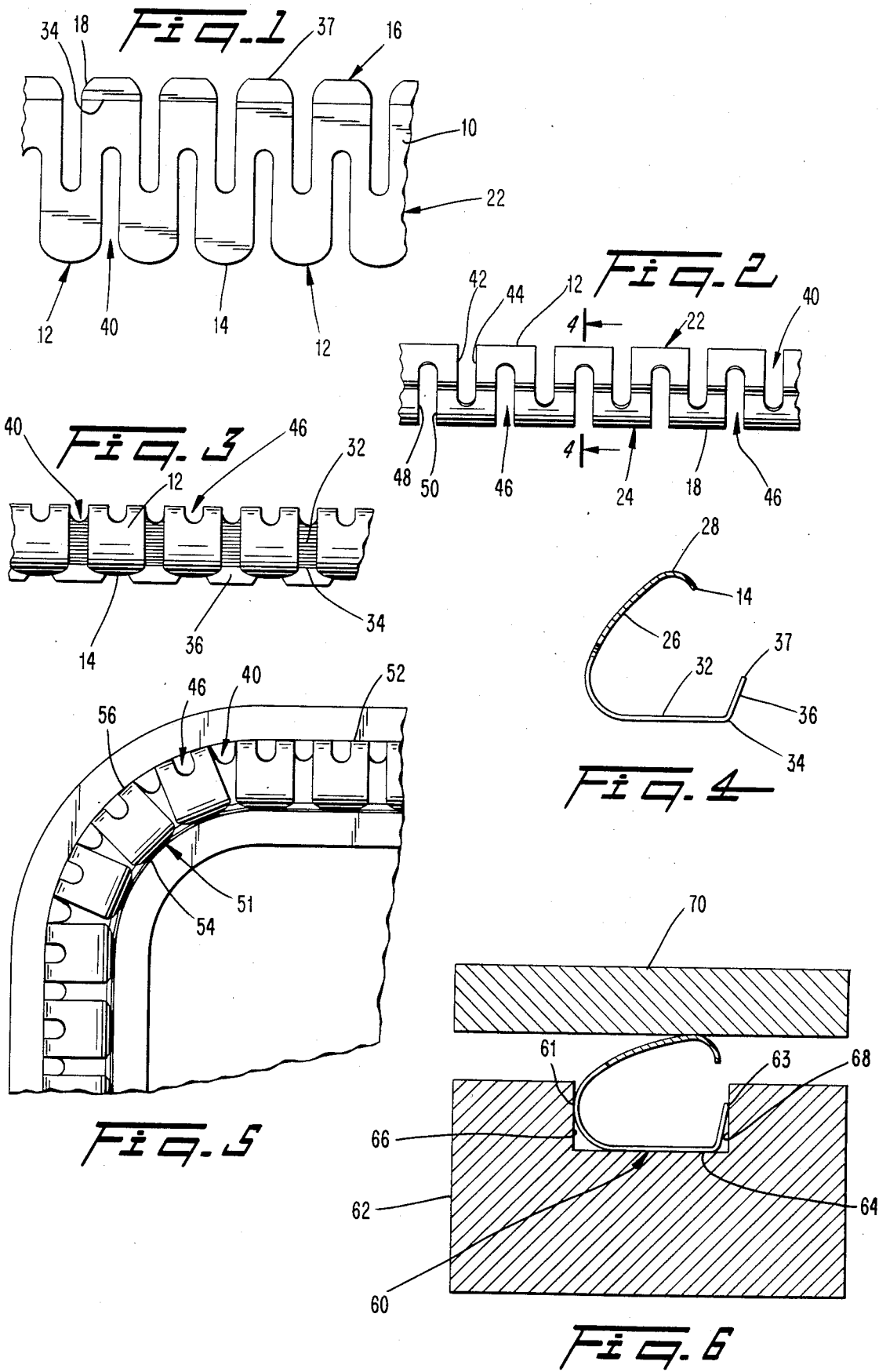

ELECTROMAGNETIC SHIELDING DEVICE

BACKGROUND AND SUMMARY OF THE PRESENT INVENTION

The present invention relates generally to shielding devices for minimizing the electromagnetic interference and susceptibility effects on electrical and electronic devices and relates especially to such shielding devices consisting of a strip of resilient metal.

It is highly desirable to provide electronic shielding for structures such as test rooms and for enclosures for radio transmitters, radio receivers, computers and other equipment requiring electronic shielding. Such structures often have movable or removable members provided in the form of doors, access panels, drawers, or other non-fixed portions of the structures. Additionally, fixed joints for the structures may also involve permanent connections, attached panels, and other connections which are not readily removable. It is highly desirable to seal these joints effectively against electromagnetic interference and susceptibility effects with a conductive member that permits a dissipation of electrical charges and fields and thereby isolates an offending circuit from a structure to be shielded.

A variety of devices have been prepared for shielding such fixed and movable joints, but these proposals have not been entirely satisfactory. If the shielding device is configured of metal, especially beryllium copper, it has heretofore been difficult or impossible to readily conform the device to an irregular configuration. Since the prior art shielding strips could not be readily curved (after manufacture) to form a rounded corner, special corner sections are typically provided by the manufacturer. As a result, the passageway to be sealed by the shielding device of the known constructions has to have a particular predetermined configuration corresponding to the available corner sections.

Another problem or disadvantage of the prior art shielding devices is the frequent requirement of some sort of fastening or attachment device. Typically, these fasteners consist of double-sided adhesive strips, screws, rivets or other mechanical fastening mechanisms. These fasteners sometimes necessitate special insertion tools and frequently result in increased cost and increased time for attachment to the structure to be shielded.

One form of prior shielding arrangement is disclosed in U.S. Pat. No. 3,277,230, issued on Oct. 4, 1966 to Stickney et al. The Stickney et al patent discloses an electronic shielding gasket that includes a linear metallic strip having a center portion with holes provided therealong and fingers extending in rows along opposite edges of the center portion of the gasket. A special fastening device is required in order to secure the gasket to a supporting surface. The Stickney et al gasket requires a substantial portion of the surface area of the passageway closure due to the lateral extent of the fingers forming part of the gasket.

Another known shielding arrangement is disclosed in U.S. Pat. No. 3,904,810, issued on Sept. 9, 1975 to Kraus. The Kraus patent discloses an electrically conductive contact spring strip that includes a row of parallel spring elements, each of which has a protuberance located on its anterior and posterior surfaces, respectively. An additional mounting structure is required in order to secure the spring strip to its mounting surface. A further limitation of this shielding arrangement is the degree of electrical contact provided by the arrangement of protuberances on the spring elements.

Other types of electromagnetic shielding arrangements including linear metallic strips arranged upon one of two opposing surfaces are disclosed in U.S. Pat. No. 3,504,095, issued on Mar. 31, 1970 to Roberson et al and in IBM Technical Disclosure Bulletin Vol. 12, No. 3, p. 413, (August, 1969); Vol. 13, No. 10, p. 3095, (March, 1971); and Vol. 14, No. 8, p. 2534, (January, 1972). Another prior art patent disclosing an electromagnetic interference and shielding device is U.S. Pat. No. 4,115,655 which issued on Sept. 19, 1978 to Prentice.

Accordingly, it is an object of the present invention to provide an electromagnetic shielding device which can readily conform to an irregular configuration.

Another object of the present invention is to provide an electromagnetic shielding device which is attachable to one member of the structure to be shielded without the use of a separate mechanical fastener.

Still another object of the present invention is to provide an electromagnetic shielding device which is effective to obtain and retain good electrical contact between the surfaces of two relatively movable members even after repeated openings and closings of the members.

A further object of the present invention is to improve the mounting of the shielding device on one of the opposed surfaces whereby the configuration of the mounting arrangement of the shielding device provides and insures good electrical contact with the opposed surfaces without interference by a fastener located between the opposed surfaces being bridged by the shielding device.

Still a further object of the present invention is to provide an electromagnetic shielding device in strip form of metal which is configured so as to permit placement along a wide variety of surface contours.

Yet still another object of the present invention is to provide an electromagnetic shielding device which is relatively inexpensive to manufacture and easy to install such that no tools or special equipment are required to effect installation.

These and other objects are accomplished by an electromagnetic shielding device in accordance with the present invention including a continuous metallic strip defining a plurality of fingers and a base portion. Each of the fingers is joined at one end to the base portion and has a free end which extends in a curved configuration over the base portion. The base portion defines a plurality of segments each having a free end.

BRIEF DESCRIPTION OF THE DRAWINGS

A preferred embodiment of the present invention will be described in greater detail with reference to the accompanying drawings, wherein like members bear like reference numerals and wherein:

FIG. 1 is a top view of the shielding device according to the present invention in a flat configuration;

FIG. 2 is a side view of the shielding device according to the present invention;

FIG. 3 is a top view of the shielding device of FIG. 2;

FIG. 4 is a view along the line 4—4 of FIG. 2;

FIG. 5 is a top view of the shielding device of FIG. 2 mounted in a channel of a member; and FIG. 6 is a side view in cross-section of the shielding device of FIG. 2 in partial compression between two relatively movable members.

DETAILED DESCRIPTION OF THE PREFERRED EMBODIMENT

With reference to FIG. 1, the shielding device according to the present invention is shown in a flat configuration in order to facilitate the illustration of the various portions which comprise the shielding device. A strip of material (preferably beryllium copper) is cut or stamped, e.g., by suitable dies in a manner readily apparent to one skilled in the art, into the shielding device 10. A plurality of fingers 12 are provided in the device 10 with each of the fingers being rounded at the free end 14 thereof. The fingers 12 are joined to one another by a base portion 16 which is comprised of a plurality of segments 18. The fingers extend in a curved configuration over the base portion to define a concave structure. Each of the segments 18 joins two adjacent fingers 12 in the preferred embodiment.

With reference now to FIG. 2, the electromagnetic shielding device according to the preferred embodiment has been bent or curved so that the plurality of fingers 12 and a plurality of spaces 40 therebetween define a top portion 22. Similarly, the base portion 16 (comprised of the plurality of segments 18 and a plurality of spaces 46 therebetween) defines a bottom portion 24 for the device 10. After formation the shielding device 10 is preferably heat treated in a manner known by those skilled in the art to impart a desired level of resiliency and durability to the metal. Each of the fingers 12 includes an upwardly curved portion 26 that turns inward at an apex of curvature 28 to form the inwardly curved free end 14 (see FIG. 4). The bottom portion 24 of the shielding device includes an outwardly angled flat portion 32 which sharply turns inward at a bend 34 to form a flat end 36 having a straight free edge 37. An obtuse angle, as measured internally, is formed at the bend 34 between the portions 32 and 36.

With continued reference to FIG. 4, when the shielding device is viewed on end, the segments 18 comprising the bottom portion 24 of the shielding device extend outwardly beyond the fingers 12 comprising the top portion 22 of the device 10. In this way, relative movement of the fingers 12 toward the segments 18 (comprising the top and bottom portions, respectively, of the shielding device) upon compression of the top 22 will occur in a manner such that the free ends 14 of the fingers 12 will typically not extend beyond the edge of the flat end 36 of the bottom portion 24.

The fingers 12 of the shielding device are gently rounded (in cross section) in order to provide for a large area of contact with an opposing surface. This large area of contact provides for an optimal electrical connection between the shielding device and the opposing surface.

With reference to FIG. 2, in the preferred embodiment, each of the plurality of spaces 40 have parallel sidewalls 42, 44 defined between adjacent fingers 12 comprising the top portion of the shielding device.

Similarly, each of the plurality of spaces 46 have parallel sidewalls 48, 50 defined between adjacent segments 18 comprising the bottom portion of the shielding device. However, the spaces 40, 46 have parallel sidewalls typically only when the device 10 is arranged in linear configuration (see FIGS. 2 and 3). When the device 10 is arranged so as to conform to a bend or other non-linear configuration, the sidewalls of the spaces 40 and 46 may be directed toward or away from one another (see FIG. 5). The spaces 40, 46, while separating adjacent fingers and segments in the shielding device, preferably also extend respectively beyond the top portion 22 and the bottom portion 24 of the shielding device to thereby partially bisect a corresponding finger 12 or segment 18 (see FIG. 2). In this manner, the ability of the shielding device (according to the preferred embodiment) to conform to an irregular shape is significantly enhanced.

If desired, however, the fingers and segments which comprise the device 10 could be aligned with one another rather than being offset as in the present invention. In such a configuration, however, the spaces defined between the pairs of adjacent fingers and between the pairs of adjacent segments would be likewise aligned with one another. Therefore, the spaces between the fingers in that embodiment would not extend into the associated segments and likewise the spaces between the segments would not extend into the associated fingers. Instead, a plurality of bridge segments would connect the pairs of fingers and the pairs of segments preferably at a midpoint between the free ends of the fingers and segments in a manner readily apparent to one skilled in the art.

With reference to FIG. 5, the shielding device 10 is mounted in a bend 51 of a channel 52. Since the radius of curvature of the inside wall 54 of the channel is less than that of the outside wall 56, the length of a front portion of the shielding device 10 must be less than that for the back portion. In order to accommodate this variation in length, the spaces 40, 46 separating the adjacent fingers 12 and the adjacent segments 18 narrow or "pinch-in" near their respective open ends.

In a converse fashion, if the orientation of the device 10 in the channel 52 were reversed, the spaces 40, 46 separating the adjacent fingers 12 and the adjacent segments 18 would widen or "pinch out" at their open ends. In this manner, the shielding device of the present invention is able to adapt to the contour of generally any channel in which it is mounted.

The minimum radius of curvature for the device, of course, depends upon the size of the segments, fingers, spaces, etc. In the preferred embodiment, however, the width of the base portion is about 0.230 inch and is urged into a channel having a width of 0.224 inch. The corresponding uncompressed height of the device is about 0.200 inch.

With reference to FIG. 6, mounting of the shielding device 10 in a milled channel 60 of a member 62 is depicted. The channel 60 is defined by a bottom surface 64 and two sidewalls 66, 68. Electrical and physical contact is made by the shielding device with the walls and base of the channel 60. In addition to the line contacts 61, 63 made by the device 10 along the sidewalls 66 and 68 by the back portion and free end of the segments 18, the flat bottom surface of the segments 18 also makes planar contact with the bottom surface 64 of the channel 60. In this way, good electrical contact with the member 62 is insured.

Preferably, the width of the channel 60 is predetermined so as to urge the outwardly angled flat portion 32 of the segments 18 inwardly toward the interior of the device 10. In this way the straight free edge 37 of the free flat end 36 of the segments 18 will securely engage the sidewall 68 of the channel at the point 63. The resiliency of the device 10 will thereby frictionally maintain the base portion 16 of the device 10 in the channel 60 without the use of additional mounting devices such as adhesives and rivets.

When another member 70, such as a door or access panel, is moved toward the member 62, the fingers 12 are urged downwardly toward the base portion 16. This compression of the shielding device, as from the closure of a door, tends to flatten the device and urge each of the fingers 12 of the shielding device to move toward the segments 18.

In operation, one of the two members comprising the structure to be shielded is provided with a channel having a suitable width and configuration. The shielding device is then urged into the channel with the base portion 18 urged downwardly toward the bottom surface of the channel. Because the base portion of the device is compressed by the sidewalls of the channel, a secure mounting of the device in the channel results which insures good electrical contact with the member comprising the channel.

To shield the structure, the other member is urged against the first member to contact the fingers of the device 10. The resiliency of the device urges the fingers against the other member to result in good electrical contact between the device and the other member. Simultaneously, the resiliency of the device urges the bottom portion of the device into the channel to assist in the secure mounting of the device in the channel.

The present invention provides a relatively simple yet highly effective device for electromagnetic shielding of two relatively movable surfaces. The device may be readily mounted by way of a simple "snap-in" technique to a variety of channeled surfaces in order to ensure proper electrical contact between opposed surfaces upon closure. Further, since compressive forces on the device are distributed substantially uniformly throughout a significant portion of the device, undue stresses are not developed in the device as a result of repeated closure. Accordingly, breakage and/or deformation of the device is minimized.

The principles, preferred embodiments and modes of operation of the present invention have been described in the foregoing specification. However, the invention which is intended to be protected is not to be construed as limited to the particular embodiments disclosed. Further, the embodiment described herein is to be regarded as illustrative rather than restrictive. Variations and changes may be made by others without departing from the spirit of the present invention. Accordingly, it is expressly intended that all such variations and changes which fall within the spirit and scope of the present invention as defined in the claims, be embraced thereby.

What is claimed is:

1. An electromagnetic shielding device comprising a continuous metallic strip defining a plurality of fingers and a base portion, each of the fingers extending over the base portion and being joined at one end to the base portion in a curved configuration and having a free end which extends in an inwardly curved configuration toward the base portion, said base portion defining a plurality of individual segments each having a free end with adjacent segments being connected by an associated finger.

2. The electromagnetic shielding device of claim 1, wherein each of said segments of the base portion has a flat bottom portion and a flat free end portion, the flat bottom portion and the flat free end portion being oriented at an obtuse angle to one another.

3. The electromagnetic shielding device of claim 2, wherein the flat free end portion of each segment of the base portion has a straight free edge.

4. The electromagnetic shielding device of claim 1, wherein each of the fingers is connected to two adjacent segments of the base portion.

5. The electromagnetic shielding device of claim 4, wherein each pair of adjacent fingers defines a space therebetween having generally parallel sidewalls when the device is generally linear.

6. The electromagnetic shielding device of claim 5 wherein each pair of adjacent segments of the base portion defines a space therebetween having generally parallel sidewalls when the device is generally linear.

7. The electromagnetic shielding device of claim 6, wherein each space defined by a pair of adjacent fingers is arranged between spaces defined by adjacent pairs of segments of said base portion.

8. The electromagnetic shielding device of claim 7, wherein the continuous metallic strip is of beryllium copper.

9. The electromagnetic shielding device of claim 8, wherein each space defined by a pair of adjacent fingers extends into an associated segment.

10. The electromagnetic shielding device of claim 9, wherein each space defined by a pair of adjacent segments extends into an associated finger.

11. The electromagnetic shielding device of claim 5, wherein the continuous metallic strip is of beryllium copper.

12. The electromagnetic shielding device of claim 1, wherein the continuous metallic strip is of beryllium copper.

13. An electromagnetic shielding device system, comprising:
a member to be shielded having at least one support surface; and
an electromagnetic shielding device comprising a continuous metallic strip defining a plurality of fingers and a base portion, each of the fingers being joined at one end to the base portion and having a free end which extends in a curved configuration over the base portion, said base portion defining a plurality of segments each having a free end and having an outer surface in engagement with said support surface of said member.

14. The electromagnetic shielding device system of claim 13, wherein each of said segments of the base portion has a flat bottom portion and a flat free end portion, the flat bottom portion and the flat free end portion being oriented at an obtuse angle to one another.

15. The electromagnetic shielding device system of claim 14, wherein the flat free end portion of each segment of the base portion has a straight free edge.

16. The electromagnetic shielding device system of claim 15, wherein the support surface includes a channel with the base portion of the strip resiliently received within the channel.

17. The electromagnetic shielding device system of claim 13, wherein each of the fingers is connected to two adjacent segments of the base portion.

18. The electromagnetic shielding device system of claim 17, wherein each pair of adjacent fingers defines a space therebetween having generally parallel sidewalls when the device is generally linear.

19. The electromagnetic shielding device system of claim 18, wherein each pair of adjacent segments of the base portion defines a space therebetween having generally parallel sidewalls when the device is generally linear.

20. The electromagnetic shielding device system of claim 19, wherein the continuous metallic strip is of beryllium copper.

21. The electromagnetic shielding device system of claim 13, wherein the continuous metallic strip is of beryllium copper.

22. An electromagnetic shielding device comprising a continuous metallic strip defining a plurality of fingers and a base portion, each of the fingers being joined at one end to the base portion and having a free end which extends in a curved configuration over the base portion, said base portion defining a Plurality of segments each having a flat bottom portion and a flat free end portion, the flat bottom portion and the flat free end portion being oriented at an obtuse angle to one another, said flat free end portion extending toward said fingers.

23. The electromagnetic shielding device of claim 22, wherein the flat free end portion of each segment of the base portion has a straight free edge.

24. The electromagnetic shielding device of claim 22, wherein each of the fingers is connected to two adjacent segments of the base portion.

25. The electromagnetic shielding device of claim 24, wherein each pair of adjacent fingers defines a space therebetween having generally parallel sidewalls when the device is generally linear.

26. The electromagnetic shielding device of claim 25, wherein each pair of adjacent segments of the base portion defines a space therebetween having generally parallel sidewalls when the device is generally linear.

27. The electromagnetic shielding device of claim 25, wherein the continuous metallic strip is of beryllium copper.

28. The electromagnetic shielding device of claim 22, wherein the continuous metallic strip is of beryllium copper.

* * * * *